US012628523B2

(12) United States Patent
Lee et al.

(10) Patent No.: US 12,628,523 B2
(45) Date of Patent: May 12, 2026

(54) DISPLAY APPARATUS

(71) Applicant: Samsung Display Co., Ltd., Yongin-si (KR)

(72) Inventors: Yeongho Lee, Yongin-si (KR); Haseok Jeon, Yongin-si (KR); Jihyun Kim, Yongin-si (KR); Junhee Lee, Yongin-si (KR); Choongyoul Im, Yongin-si (KR); Hyunduck Cho, Yongin-si (KR); Kookhyun Choi, Yongin-si (KR); Seongyong Hwang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 471 days.

(21) Appl. No.: 18/364,183

(22) Filed: Aug. 2, 2023

(65) Prior Publication Data

US 2024/0147806 A1 May 2, 2024

(30) Foreign Application Priority Data

Oct. 27, 2022 (KR) ........................ 10-2022-0140505

(51) Int. Cl.
*H10K 59/38* (2023.01)
*H10K 59/123* (2023.01)
(Continued)

(52) U.S. Cl.
CPC ........... *H10K 59/38* (2023.02); *H10K 59/123* (2023.02); *H10K 59/873* (2023.02); *H10K 59/8792* (2023.02); *H10K 59/88* (2023.02)

(58) Field of Classification Search
CPC ...... H10K 59/38; H10K 59/873; H10K 59/88; H10K 59/123; H10K 59/8792
See application file for complete search history.

(56) References Cited

U.S. PATENT DOCUMENTS 9,099,415 B2 8/2015 Park
10,020,351 B2 * 7/2018 Yang ................... H10K 59/124
(Continued)

FOREIGN PATENT DOCUMENTS

JP        2010-287421        12/2010
KR    10-2018-0000975        1/2018
(Continued)

*Primary Examiner* — Mary Ellen Bowman
(74) *Attorney, Agent, or Firm* — Womble Bond Dickinson (US) LLP

(57) ABSTRACT

A display apparatus for minimizing image quality deterioration occurring due to external light includes a first pixel electrode arranged on a substrate, a pixel-defining layer arranged on the substrate, covering an edge of the first pixel electrode, and including a 1-1$^{st}$ pixel opening exposing a portion of the first pixel electrode, a spacer layer arranged on the pixel-defining layer and including a 2-1$^{st}$ pixel opening corresponding to the 1-1$^{st}$ pixel opening and exposing the portion of the first pixel electrode, and a first color filter layer arranged on the first pixel electrode and selectively transmitting light of a first wavelength range. In a plan view, a first length between an edge of the 1-1$^{st}$ pixel opening and an edge of the 2-1$^{st}$ pixel opening in a direction corresponds to the first wavelength range.

20 Claims, 10 Drawing Sheets

(51) Int. Cl.
    *H10K 59/80*         (2023.01)
    *H10K 59/88*         (2023.01)

(56)             References Cited

U.S. PATENT DOCUMENTS

| | | | |
|---|---|---|---|
| 10,680,052 B2 * | 6/2020 | Lee | H10K 59/8792 |
| 11,296,159 B2 * | 4/2022 | Choi | H10K 50/115 |
| 2017/0098690 A1 * | 4/2017 | Lee | H10K 59/879 |
| 2017/0373124 A1 * | 12/2017 | Yang | H10K 59/879 |
| 2019/0348482 A1 * | 11/2019 | Bae | H10K 59/124 |
| 2020/0258944 A1 * | 8/2020 | Joo | H10K 59/38 |
| 2021/0376291 A1 * | 12/2021 | Park | H10K 59/88 |
| 2022/0149136 A1 | 5/2022 | Lee et al. | |
| 2022/0223667 A1 | 7/2022 | Choi et al. | |
| 2022/0231087 A1 * | 7/2022 | Jeon | H10K 59/38 |
| 2023/0189575 A1 * | 6/2023 | Yuk | H10K 50/865 |
| | | | 257/40 |

FOREIGN PATENT DOCUMENTS

| | | |
|---|---|---|
| KR | 10-2020-0119946 | 10/2020 |
| KR | 10-2021-0016230 | 2/2021 |
| KR | 10-2021-0073333 | 6/2021 |
| KR | 10-2022-0065164 | 5/2022 |

* cited by examiner

DISPLAY APPARATUS

CROSS-REFERENCE TO RELATED APPLICATION(S)

This application claims priority to and benefits of Korean Patent Application No. 10-2022-0140505 under 35 U.S.C. § 119, filed on Oct. 27, 2022, in the Korean Intellectual Property Office (KIPO), the entire contents of which are incorporated herein by reference.

BACKGROUND

1. Technical Field

The disclosure relates to a display apparatus for minimizing deterioration of image quality which may occur due to external light.

2. Description of the Related Art

A display apparatus displays an image by receiving information about the image. When external light is irradiated to a display apparatus, a so-called rainbow phenomenon in which light is emitted with colors separating according to a wavelength may occur. The rainbow phenomenon may cause deterioration of image quality of a display apparatus, when a user uses the display apparatus in an external environment.

SUMMARY

The disclosure includes a display apparatus for minimizing image-quality deterioration caused by external light. However, this objective is an example and does not limit the scope of the disclosure.

Additional aspects will be set forth in part in the description which follows and, in part, will be apparent from the description, or may be learned by practice of the presented embodiments of the disclosure.

According to an embodiment, a display apparatus may include a first pixel electrode arranged on a substrate, a pixel-defining layer arranged on the substrate, covering an edge of the first pixel electrode, and including a $1$-$1^{st}$ pixel opening exposing a portion of the first pixel electrode, a spacer layer arranged on the pixel-defining layer and including a $2$-$1^{st}$ pixel opening corresponding to the $1$-$1^{st}$ pixel opening and exposing the portion of the first pixel electrode, and a first color filter layer arranged on the first pixel electrode and selectively transmitting light of a first wavelength range. In a plan view, a first length between an edge of the $1$-$1^{st}$ pixel opening and an edge of the $2$-$1^{st}$ pixel opening in a direction may correspond to the first wavelength range.

The display apparatus may further include a second pixel electrode arranged on the substrate spaced apart from the first pixel electrode, and a second color filter layer arranged on the second pixel electrode and selectively transmitting light of a second wavelength range that is different from the first wavelength range. The first pixel electrode and the second pixel electrode may be arranged on a same layer. The pixel-defining layer may cover an edge of the second pixel electrode and further include a $1$-$2^{nd}$ pixel opening exposing a portion of the second pixel electrode. The spacer layer may further include a $2$-$2^{nd}$ pixel opening corresponding to the $1$-$2^{nd}$ pixel opening and exposing the portion of the second pixel electrode. In a plan view, a second length between an edge of the $1$-$2^{nd}$ pixel opening and an edge of the $2$-$2^{nd}$ pixel opening in the direction may correspond to the second wavelength range.

The first wavelength range may be greater than the second wavelength range, and the first length may be greater than the second length.

The first length may be in a range of about 1.5 μm to about 2.5 μm.

An area of the $2$-$1^{st}$ pixel opening may be greater than an area of the $1$-$1^{st}$ pixel opening, in a plan view.

The spacer layer may cover at least a portion of a side surface of the $1$-$1^{st}$ pixel opening.

The edge of the $2$-$1^{st}$ pixel opening may overlap the side surface of the $1$-$1^{st}$ pixel opening, in a plan view.

An area of the $2$-$1^{st}$ pixel opening may be greater than or equal to an area of the $1$-$1^{st}$ pixel opening, in a plan view.

A $2$-$1^{st}$ acute angle formed between a side surface of the $2$-$1^{st}$ pixel opening and an upper surface of the substrate may correspond to the first wavelength range, and a $2$-$2^{nd}$ acute angle formed between a side surface of the $2$-$2^{nd}$ pixel opening and the upper surface of the substrate may correspond to the second wavelength range.

The first wavelength range may be greater than the second wavelength range, and the $2$-$1^{st}$ acute angle may be less than the $2$-$2^{nd}$ acute angle.

The $2$-$1^{st}$ acute angle may be in a range of about 30 degrees to about 45 degrees.

A $1$-$1^{st}$ acute angle formed between the side surface of the $1$-$1^{st}$ pixel opening and the upper surface of the substrate may be less than the $2$-$1^{st}$ acute angle.

The display apparatus may further include a thin-film encapsulation layer arranged on the first pixel electrode, the pixel-defining layer, and the spacer layer, and a light-blocking layer arranged on the thin-film encapsulation layer along an edge of the first color filter layer, having at least a portion covered by the edge of the first color filter layer, and including a $3$-$1^{st}$ pixel opening arranged above the $2$-$1^{st}$ pixel opening and exposing an upper surface of the thin-film encapsulation layer.

An area of the $3$-$1^{st}$ pixel opening may be greater than an area of the $1$-$1^{st}$ pixel opening, in a plan view.

The edge of the $2$-$1^{st}$ pixel opening may overlap the light-blocking layer, in a plan view.

A side surface of the $2$-$1^{st}$ pixel opening may overlap the light-blocking layer, in a plan view.

A thickness of the spacer layer in a thickness direction of the substrate may be less than or equal to about 0.4 μm.

A length from an upper surface of the pixel-defining layer to an upper surface of the substrate may be less than or equal to about 1 μm.

A $1$-$1^{st}$ acute angle formed between a side surface of the $1$-$1^{st}$ pixel opening and an upper surface of the substrate may be greater than or equal to about 70 degrees.

According to an embodiment, a display apparatus may include a first pixel electrode arranged on a substrate, a pixel-defining layer arranged on the substrate, covering an edge of the first pixel electrode, and including a $1$-$1^{st}$ pixel opening exposing at least a portion of the first pixel electrode, and a spacer layer arranged on the pixel-defining layer, including a $2$-$1^{st}$ pixel opening corresponding to the $1$-$1^{st}$ pixel opening and exposing at least the portion of the first pixel electrode, and covering at least a portion of a side surface of the $1$-$1^{st}$ pixel opening. In a plan view, an area of the $2$-$1^{st}$ pixel opening may be greater than or equal to an area of the $1$-$1^{st}$ pixel opening.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
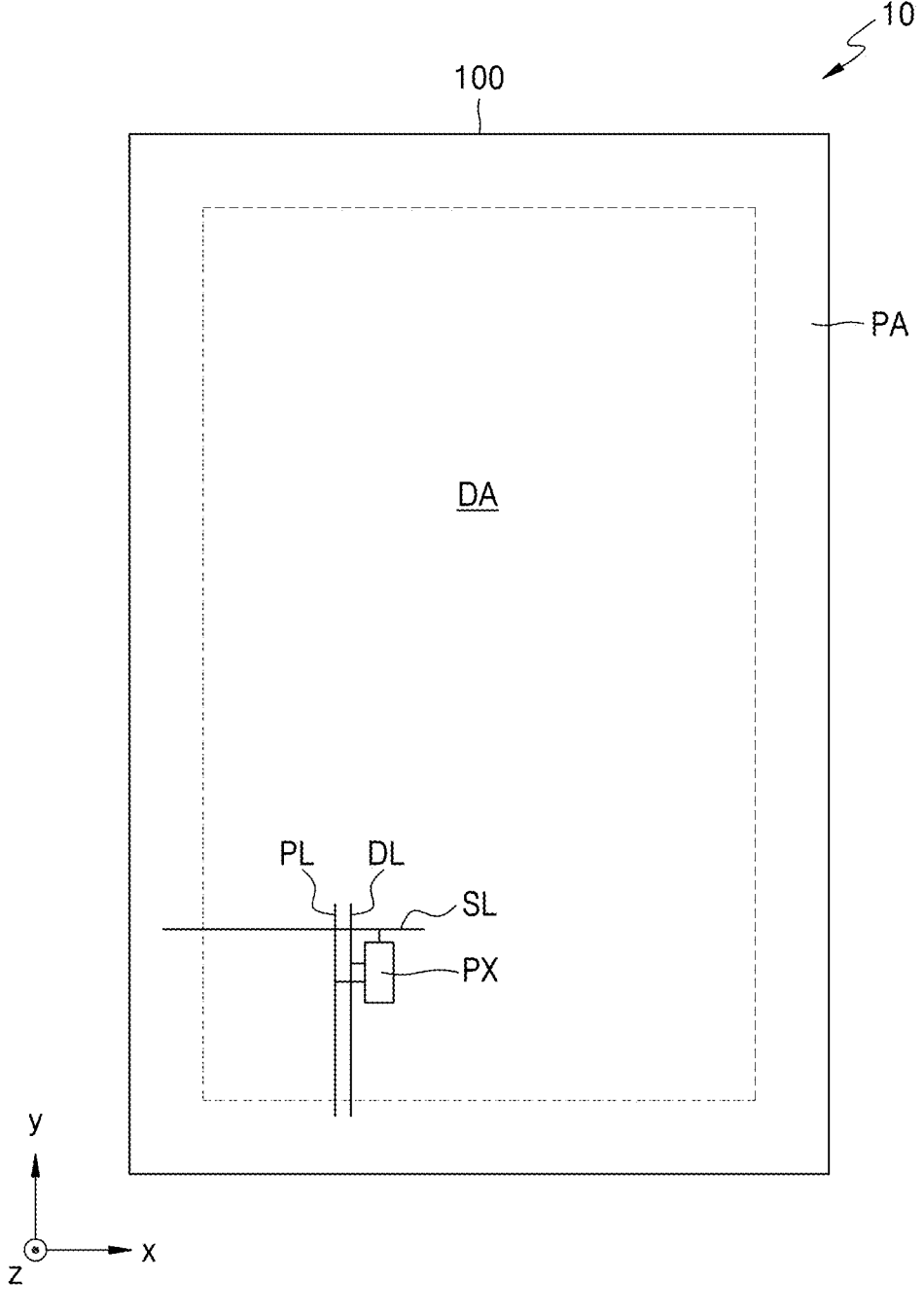
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. For the purposes of this disclosure, "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z. In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, embodiments of the disclosure will be described in detail by referring to the accompanying drawings. In descriptions with reference to the drawings, the same reference numerals are given to elements that are the same or substantially the same and descriptions will not be repeated.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Also, when an element is referred to as being "in contact" or "contacted" or the like to another element, the element may be in "electrical contact" or in "physical contact" with another element; or in "indirect contact" or in "direct contact" with another element. Also, for convenience of explanation, elements in the drawings may have exaggerated or reduced sizes. For example, sizes and thicknesses of the elements in the drawings are randomly indicated for convenience of explanation, and thus, the disclosure is not necessarily limited to the illustrations of the drawings.

In the embodiments hereinafter, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, a display apparatus according to an embodiment is described in detail based on the above descriptions.

FIG. 1 is a schematic plan view of a display apparatus according to an embodiment.

As illustrated in FIG. 1, the display apparatus according to an embodiment may include a display panel 10. The display apparatus may be any types of display apparatuses that include the display panel 10. For example, the display apparatus may include various devices, such as a smartphone, a tablet computer, a laptop, a television, or an advertising board. The display apparatus according to an embodiment may include thin-film transistors, a capacitor, etc., wherein the thin-film transistors, the capacitor, etc. may include conductive layers and insulating layers.

The display panel 10 may include a display area DA and a peripheral area PA adjacent to the display area DA. FIG. 1 illustrates that the display area DA has a rectangular shape. However, the disclosure is not limited thereto. The display area DA may have various shapes, such as a circular shape, an oval shape, a polygonal shape, etc.

The display area DA may be an area in which an image is displayed, and multiple pixels PX may be arranged in the display area DA. Each pixel PX may include a display device, such as an organic light-emitting diode. Each pixel PX may emit, for example, red, green, or blue light. The pixel PX may be connected to a pixel circuit including a thin-film transistor, a storage capacitor, etc. The pixel circuit may be connected to a scan line SL configured to transmit a scan signal, a data line DL intersecting the scan line SL and configured to transmit a data signal, a driving voltage line PL configured to supply a driving voltage, etc. The scan line SL may extend in an x direction (hereinafter, a second direction), and the data line DL and the driving voltage line PL may extend in a y direction (hereinafter, a first direction).

The pixel PX may emit light having a brightness corresponding to an electrical signal from the pixel circuit electrically connected to the pixel PX. The display area DA may display an image through the light emitted from the pixel PX. For example, the pixel PX may be defined as an emission area in which one of red, green, and blue light is emitted as described above.

The peripheral area PA may be an area in which the pixel PX is not arranged and may be an area in which an image is not displayed. A power supply line, etc. configured to drive the pixel PX may be arranged in the peripheral area PA. Also, multiple pads may be arranged in the peripheral area PA, and a printed circuit board including a driving circuit portion or an integrated circuit device, such as a driver integrated circuit (IC), may be arranged and electrically connected to the pads.

In an embodiment, the display panel 10 may include a substrate 100, and the substrate 100 may include the display area DA and the peripheral area PA. Detailed aspects with respect to the substrate 100 will be described below.

Multiple transistors may be arranged in the display area DA. With respect to the transistors, according to types (N types or P types) and/or operation conditions of the transistors, first terminals of the transistors may be one of a source electrode and a drain electrode, and second terminals may be another one of a source electrode and a drain electrode. For example, in case that the first terminal is a source electrode, the second terminal may be a drain electrode.

The transistors may include a driving transistor, a switching thin-film transistor, a compensation transistor, an initialization transistor, an emission control transistor, etc. The driving transistor may be connected between the driving voltage line PL and the organic light-emitting diode OLED, and the switching thin-film transistor may be connected to the data line DL and the driving transistor and may be configured to perform a switching operation of transmitting, to the driving transistor, a data signal transmitted through the data line DL.

The compensation transistor may be turned on by a scan signal transmitted through the scan line SL and configured to connect the driving transistor with the organic light-emitting diode OLED to compensate a threshold voltage of the driving transistor.

The initial transistor may be turned on by a scan signal transmitted through the scan line SL and configured to transmit an initialization voltage to a gate electrode of the driving transistor to initialize the gate electrode of the driving transistor. The scan line connected to the initialization transistor and the scan line connected to the compensation transistor may be different scan lines.

The emission control transistor may be turned on by an emission control signal transmitted through an emission control line, and as a result, a driving current may flow through the organic light-emitting diode OLED.

The organic light-emitting diode OLED may include a pixel electrode (an anode) and an opposite electrode (a cathode), and the opposite electrode 160 may receive a common voltage ELVSS. The organic light-emitting diode OLED may emit light by receiving a driving current from the driving transistor, thereby displaying an image.

Hereinafter, an organic light-emitting display apparatus is described as an example of the display apparatus according to an embodiment. However, the display apparatus according to an embodiment is not limited thereto. The display apparatus according to another embodiment may include an inorganic light-emitting display apparatus, an inorganic electroluminescent (EL) display apparatus, or a quantum dot light-emitting display apparatus. For example, an emission layer of the display device included in the display apparatus may include an organic material or an inorganic material. Also, the display apparatus may include an emission layer and quantum dots located on a path of the light emitted from the emission layer.

Figure 2:
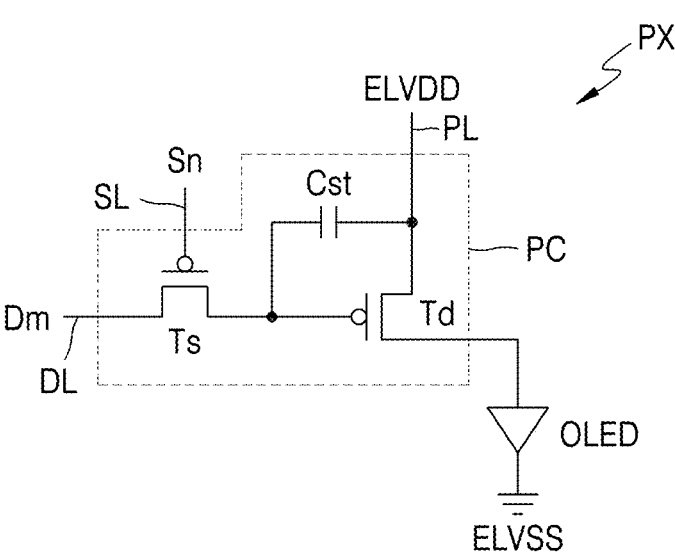
FIG. 2 is a schematic diagram of an equivalent circuit of a pixel of the display apparatus of FIG. 1.

FIG. 2 is a schematic diagram of an equivalent circuit of the pixel PX of the display apparatus of FIG. 1.

As illustrated in FIG. 2, each pixel PX may include a pixel circuit PC connected to a scan line SL and a data line DL, and the organic light-emitting diode OLED connected to the pixel circuit PC.

The pixel circuit PC may include a driving thin-film transistor Td, a switching thin-film transistor Ts, and a storage capacitor Cst. The switching thin-film transistor Ts may be connected to the scan line SL and the data line DL and may be configured to transmit a data signal Dm provided through the data line DL, to the driving thin-film transistor Td, in response to a scan signal Sn provided through the scan line SL.

The storage capacitor Cst may be connected to the switching thin film transistor Ts and a driving voltage line PL and may be configured to store a voltage corresponding to a difference between a voltage received from the switching thin film transistor Ts and a first power voltage ELVDD (or a driving voltage) supplied to the driving voltage line PL.

The driving thin-film transistor Td may be connected to the driving voltage line PL and the storage capacitor Cst and may be configured to control a driving current flowing from the driving voltage line PL to the organic light-emitting diode OLED according to the voltage stored in the storage capacitor Cst. The organic light-emitting diode OLED may emit light having a brightness according to the driving current.

It is described with in FIG. 2 that the pixel circuit PC includes two thin-film transistors and one storage capacitor. However, the disclosure is not limited thereto. The pixel circuit PC may include three or more thin-film transistors and two or more storage capacitors.

Figure 3:
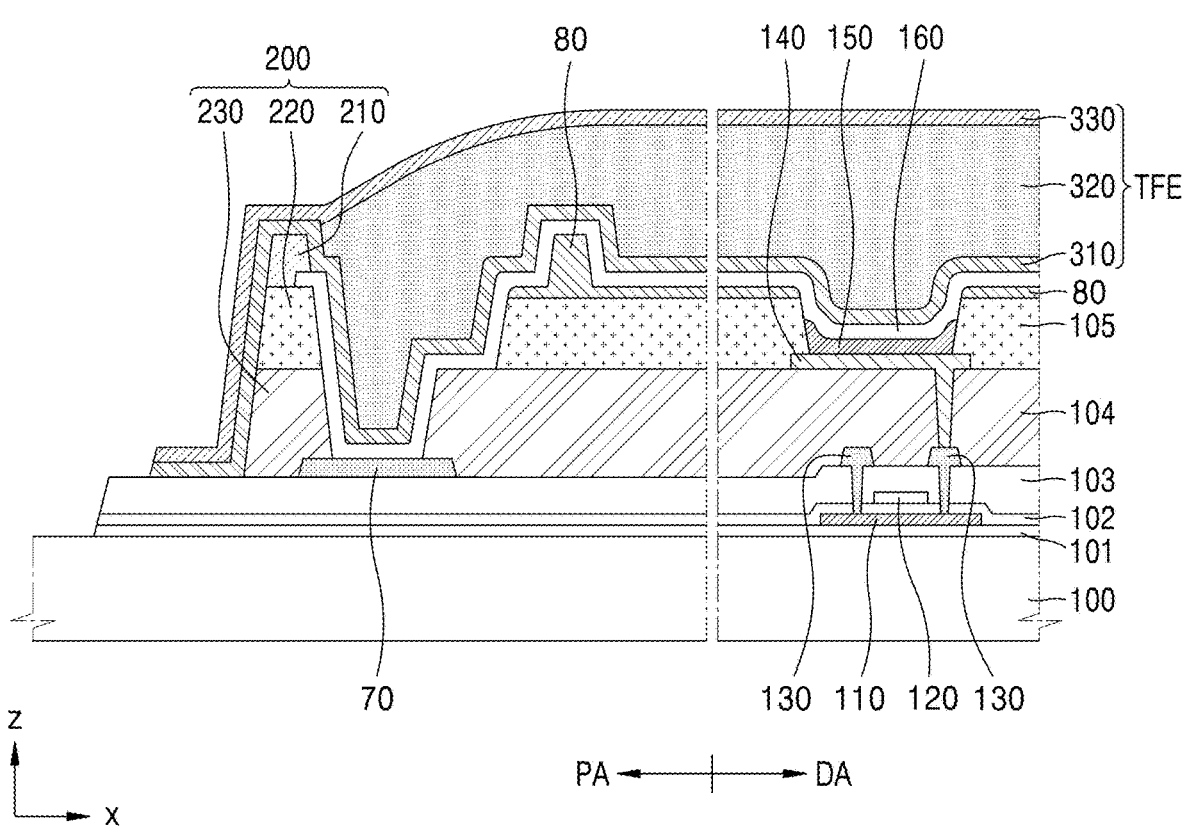
FIG. 3 is a schematic cross-sectional view of a portion of the display apparatus of FIG. 1.

FIG. 3 is a schematic cross-sectional view of a portion of the display apparatus of FIG. 1.

As described above, the substrate 100 may include areas corresponding to the display area DA and the peripheral area PA adjacent to the display area DA. The substrate 100 may include various materials having flexible or bendable properties. In an embodiment, the substrate 100 may include glass, metal, or a polymer resin. For example, the substrate 100 may include a polymer resin including polyethersulphone, polyacrylate, polyetherimide, polyethylene naphthalate, polyethylene terephthalate, polyphenylene sulfide, polyarylate, polyimide, polycarbonate, or cellulose acetate propionate. However, various modifications may be possible. For example, the substrate 100 may have a multi-layered structure including: two layers each including a polymer resin described above; and a barrier layer between the two layers, the barrier layer including an inorganic material (such as silicon oxide, silicon nitride, silicon oxynitride, or the like).

A buffer layer 101 may be arranged on the substrate 100. The buffer layer 101 may prevent diffusion of impurity ions, prevent the penetration of water or external materials, and function as a barrier layer for planarizing a surface and/or a blocking layer. The buffer layer 101 may include silicon oxide, silicon nitride, or silicon oxynitride. Also, the buffer layer 101 may control a heat transfer speed during a crystallization process for forming a semiconductor layer 110, so that the semiconductor layer 110 may be uniformly crystallized.

The semiconductor layer 110 may be arranged on the buffer layer 101. The semiconductor layer 110 may include polysilicon and may include a channel area not doped with impurities and a source area and a drain area at each side of the channel area that are doped with an impurity. The impurity may vary according to types of thin-film transistors and may include an N-type impurity or a P-type impurity.

A gate insulating layer 102 may be arranged on the semiconductor layer 110. The gate insulating layer 102 may insulate between the semiconductor layer 110 and a gate layer 120. The gate insulating layer 102 may include an inorganic material, such as silicon oxide, silicon nitride, and/or silicon oxynitride, and may be arranged between the semiconductor layer 110 and the gate layer 120. The gate insulating layer 102 may be disposed on an entire area of the substrate 100 and may have a structure in which through-holes are formed in a portion. The insulating layer including an inorganic material may be formed by chemical vapor deposition (CVD) or atomic layer deposition (ALD). This may apply to embodiments described below and their modified embodiments.

The gate layer 120 may be arranged on the gate insulating layer 102. The gate layer 120 may be arranged above the semiconductor layer 110 to overlap the semiconductor layer 110 in a plan view and may include at least one metal selected from the group consisting of Mo, Al, Pt, Pd, Ag, Mg, Au, Ni, Nd, Ir, Cr, Li, Ca, Ti, W, and Cu.

An interlayer insulating layer 103 may be arranged on the gate layer 120. The interlayer insulating layer 103 may cover the gate layer 120. The interlayer insulating material 103 may include an inorganic material. For example, the interlayer insulating layer 103 may include metal oxide or metal nitride. For example, the inorganic material may include $SiO_2$, $SiN_x$, SiON, $Al_2O_3$, $TiO_2$, $TA_2O_5$, $HfO_2$, or $ZnO_2$. According to an embodiment, the interlayer insulating layer 103 may have a double-layered structure of $SiO_x/SiN_y$ or $SiN_x/SiO_y$.

A conductive layer 130 may be arranged above the interlayer insulating layer 103. The conductive layer 130 may serve as an electrode connected to the source area and the drain area of the semiconductor layer through a through-hole included in the interlayer insulating layer 103.

The conductive layer 130 may include at least one metal selected from the group consisting of Al, Pt, Pd, Ag, Mg, Au, Ni, Nd, Ir, Cr, Li, Ca, Mo, Ti, W, and Cu. For example, the conductive layer 130 may include a Ti layer, an Al layer, and/or a Cu layer.

An organic insulating layer 104 may be arranged on the conductive layer 130. The organic insulating layer 104 may cover an upper portion of the conductive layer 130 and may have generally a flat upper surface to serve as a planarization layer. The organic insulating layer 104 may include, for example, an organic material, such as an acrylic material, benzocyclobutene (BCB), or hexamethyldisiloxane (HMDSO). The organic insulating layer 104 may include a single layer or multi-layers and may be modified in various ways.

Although not illustrated in FIG. 3, an additional conductive layer and an additional insulating layer may be arranged between the conductive layer and the pixel electrode, and various embodiments may be implemented. The additional conductive layer and the conductive layer described above may include a same material and have same layer structure.

The additional insulating layer and the organic insulating layer described above may include a same material and have same layer structure.

Multiple pixel electrodes may be arranged on the organic insulating layer 104. The display device may be arranged on each of the pixel electrodes. As the display device, an organic light-emitting diode OLED may be used. For example, the organic light-emitting diode OLED may be arranged on each of the pixel electrodes. The pixel electrodes may include a transmissive conductive layer including a transmissive conductive oxide, such as ITO, $In_2O_3$, or IZO, and a reflection layer including a metal, such as Al or Ag. For example, each of the pixel electrodes may have a triple-layered structure of ITO/Ag/ITO.

The pixel electrodes may include a first pixel electrode 140 and a second pixel electrode (not shown). The first pixel electrode 140 may be arranged on the organic insulating layer 104. The first pixel electrode 140 may be connected to the conductive layer 130 through a contact hole formed in the organic insulating layer 104. The display device may be arranged on the first pixel electrode 140.

Hereinafter, for convenience, the description of the display apparatus will be given based on the first pixel electrode 140. However, the same description may be applied to other pixel electrodes, such as the second pixel electrode (not shown).

A pixel-defining layer 105 may be arranged above the organic insulating layer 104 to cover an edge of the first pixel electrode 140. For example, the pixel-defining layer 105 may cover the edge of the first pixel electrode 140. The pixel-defining layer 105 may have a $1\text{-}1^{st}$ pixel opening OP1 (see FIG. 4) corresponding to a pixel, and the $1\text{-}1^{st}$ pixel opening OP1 may be formed to expose at least a central portion of the first pixel electrode 140.

The pixel-defining layer 105 may include, for example, an organic material, such as polyimide or HMDSO. A spacer layer 80 may be arranged on the pixel-defining layer 105. The spacer layer 80 may be arranged in the peripheral area PA, and the spacer layer 80 may also be arranged in the display area DA. The spacer layer 80 may include a portion protruding in a direction perpendicular to the substrate 100. The protruding portion may prevent damage to the organic light-emitting diode OLED caused by sagging of a mask in a manufacturing process using the mask.

The spacer layer 80 may include, for example, an organic material, such as an acrylic material, BCB, or HMDSO. The spacer layer 80 may include a single layer or multiple layers and may be modified in various ways.

An intermediate layer 150 and the opposite electrode 160 may be arranged above the $1\text{-}1^{st}$ pixel opening OP1. The intermediate layer 150 may include a low or high molecular-weight material, and in case that the intermediate layer 150 includes a low molecular-weight material, the intermediate layer 150 may include a hole injection layer (HIL), a hole transport layer (HTL), an emission layer (ELM), an electron transport layer (ETL), and/or an electron injection layer (EIL). In case that the intermediate layer 150 includes a high-molecular weight material, the intermediate layer 150 may generally have a structure including an HTL and an EML. The opposite electrode 160 may include a transmissive conductive layer including a transmissive conductive oxide, such as ITO, $In_2O_3$, or IZO. The first pixel electrode 140 may be used as an anode, and the opposite electrode 160 may be used as a cathode. However, polarities of the electrode may be the opposite.

A structure of the intermediate layer 150 is not limited to the structure described above and may have various structures. For example, at least one of the layers included in the intermediate layer 150 may be disposed on an entire area of the display area like the opposite electrode 160. According to another embodiment, the intermediate layer 150 may include a layer patterned to correspond to each of the pixel electrodes.

The opposite electrode 160 may be arranged on the display area DA and may be arranged throughout the display area DA. For example, the opposite electrode 160 may be integrally formed to cover the pixel electrodes. The opposite electrode 160 may be electrically connected to a common power supply line 70 arranged in the peripheral area PA. According to an embodiment, the opposite electrode 160 may extend to a partition wall or a bank 200.

A thin-film encapsulation layer TFE may entirely cover the display area DA and extend to the peripheral area PA to cover at least a portion of the peripheral area PA. The thin-film encapsulation layer TFE may extend to an outer portion of the common power supply line 70 in a plan view.

The thin-film encapsulation layer TFE may include a first inorganic encapsulation layer 310, a second inorganic encapsulation layer 330, and an organic encapsulation layer 320 arranged therebetween. The first and second inorganic encapsulation layers 310 and 330 may include at least one inorganic material selected from the group consisting of $Al_2O_3$, TiO, $TA_2O_5$, $HfO_2$, ZnO, $SiO_x$, $SiN_x$, and SiON. The first and second inorganic encapsulation layers 310 and 330 may include a single layer or multiple layers including the materials described above. The first and the second inorganic encapsulation layers 310 and 330 may include a same material or different materials.

Thicknesses of the first and second inorganic encapsulation layers 310 and 330 in a thickness direction of the substrate 100 may be different from each other. The thicknesses of the first inorganic encapsulation layer 310 may be greater than the thickness of the second inorganic encapsulation layer 330. In another embodiment, the thickness of the second inorganic encapsulation layer 330 may be greater than the thickness of the first inorganic encapsulation layer 310, or the thicknesses of the first and second inorganic encapsulation layer 310 and 330 may be the same.

The organic encapsulation layer 320 may include a monomer-based material or a polymer-based material. The polymer-based material may include an acryl-based resin, an epoxy-based resin, polyimide, polyethylene, etc. According to an embodiment, the organic encapsulation layer 320 may include acrylate.

The bank 200 may be arranged in the peripheral area PA of the substrate 100. According to an embodiment, the bank 200 may include a portion 230 of the organic insulating layer 104, a portion 220 of the pixel-defining layer 105, and a portion 210 of the spacer layer 80, but the disclosure is not necessarily limited thereto. In another embodiment, the bank 200 may include only the portion 230 of the organic insulating layer 104 or only the portion 220 of the pixel-defining layer 105.

The bank 200 may be arranged to surround the display area DA in a plan view and may prevent overflowing of the organic encapsulation layer 320 of the thin-film encapsulation layer TFE to the outside of the substrate 100. Thus, the organic encapsulation layer 320 may contact an inner surface of the bank 200 that faces the display area DA. In an embodiment, the first inorganic encapsulation layer 310 may be arranged between the organic encapsulation layer 320 and the bank 200, and the organic encapsulation layer 320 may contact the first inorganic encapsulation layer 310. The first inorganic encapsulation layer 310 and the second inorganic encapsulation layer 330 may be arranged on the bank 200 and may extend to an edge of the substrate 100.

Figure 4:
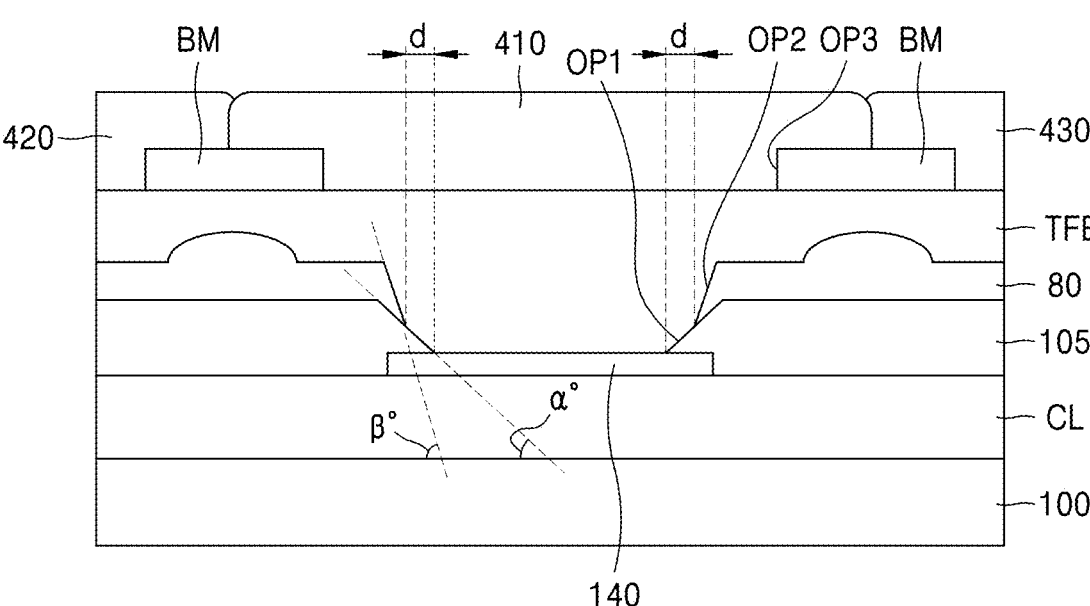
FIG. 4 is a schematic cross-sectional view of a region around a spacer layer of the display apparatus of FIG. 1.

FIG. 4 is a schematic cross-sectional view of a region around the spacer layer 80 of the display apparatus of FIG. 1.

As illustrated in FIG. 4, the display apparatus according to an embodiment may include the substrate 100, a circuit layer CL, the first pixel electrode 140, the pixel-defining layer 105, and the spacer layer 80. The circuit layer CL may include all components arranged between the substrate 100 and the first pixel electrode 140. For example, the circuit layer CL may include the buffer layer 101, the semiconductor layer 110, the gate insulating layer 102, the gate layer 120, the interlayer insulating layer 103, the conductive layer 130, and the organic insulating layer 104, and the features, such as the arrangement of the components included in the circuit layer CL may be the same as described with reference to FIGS. 1 to 3. The circuit layer CL may further include an additional conductive layer and an additional insulating layer according to an embodiment.

As described above, the first pixel electrode 140 may be arranged on the substrate 100 and may have an edge covered by the pixel-defining layer 105. The pixel-defining layer 105 may be arranged on the substrate 100, may cover the edge of the first pixel electrode 140, and may include the $1\text{-}1^{st}$ pixel opening OP1 exposing at least a portion (or at least a central portion) of the first pixel electrode 140.

The spacer layer 80 may be arranged on the pixel-defining layer 105. The spacer layer 80 may include a $2\text{-}1^{st}$ pixel opening OP2 corresponding to the $1\text{-}1^{st}$ pixel opening OP1. The $2\text{-}1^{st}$ pixel opening OP2 may expose a portion of the first pixel electrode 140. The $2\text{-}1^{st}$ pixel opening OP2 may be arranged above the $1\text{-}1^{st}$ pixel opening OP1. When viewed in a direction perpendicular to the substrate 100, or in a plan view, an area of the $2\text{-}1^{st}$ pixel opening OP2 may be greater than or equal to an area of the $1\text{-}1^{st}$ pixel opening OP1. In an embodiment, the area of the $2\text{-}1^{st}$ pixel opening OP2 may be greater than the area of the $1\text{-}1^{st}$ pixel opening OP1.

The spacer layer 80 may cover at least a portion of an inner surface of the pixel-defining layer 105. The inner surface of the pixel-defining layer 105 may be a side surface overlapping the first pixel electrode 140 from among side surfaces of the pixel-defining layer 105, when viewed in the direction perpendicular to the substrate 100.

The spacer layer 80 may cover the pixel-defining layer 105 to an edge of the pixel-defining layer 105 contacting the first pixel electrode 140. For example, the spacer layer 80 may cover at least a portion of an inner surface of the $1\text{-}1^{st}$ pixel opening OP1. However, the spacer layer 80 may not cover an upper surface of the pixel electrode 140, exposed by the $1\text{-}1^{st}$ pixel opening OP1. This is because, in case that the spacer layer 80 covers the upper surface of the pixel electrode 140, exposed by the $1\text{-}1^{st}$ pixel opening OP1, an aperture ratio of the pixel may be affected.

In case that the spacer layer 80 covers at least the portion of the inner surface of the $1\text{-}1^{st}$ pixel opening OP1, a step difference which may occur between the spacer layer 80 and the pixel-defining layer 105 may be removed or reduced. By removing or reducing the step difference which may occur between the spacer layer 80 and the pixel-defining layer 105, a rainbow phenomenon may be prevented or minimized.

The rainbow phenomenon may be a phenomenon in which external light is dispersed and reflected due to the inner surfaces and the step difference. In case that the external light is dispersed and reflected to the outside of the display apparatus, light dispersion, such as a rainbow, may be seen in case that a user views the display apparatus from the outside. It is important to prevent or minimize the rainbow phenomenon.

In case that the spacer layer 80 covers at least the portion of the inner surface of the 1-1$^{st}$ pixel opening OP1, an edge of the 2-1$^{st}$ pixel opening OP2 may overlap the inner surface of the 1-1$^{st}$ pixel opening OP1 when viewed in the direction perpendicular to the substrate 100. Also, the area of the 2-1$^{st}$ pixel opening OP2 may be greater than or equal to the area of the 1-1$^{st}$ pixel opening OP1 when viewed in the direction perpendicular to the substrate 100.

The display apparatus according to an embodiment may further include color filter layers 410, 420, and 430. The color filter layers 410, 420, and 430 may be components that selectively transmit light of a wavelength range. The wavelength range of light, in which the color filter layers 410, 420, and 430 transmit, may correspond to a wavelength range of the light emitted by the display device arranged below the color filter layer 410, 420, and 430.

In an embodiment, the color filter layers 410, 420, and 430 may include a first color filter layer 410 that transmits light of a first wavelength range, a second color filter layer 420 that transmits light of a second wavelength range different from the first wavelength range, and a third color filter layer 430 that transmits light of a third wavelength range different from the first and second wavelength ranges. For example, the first to third wavelength ranges may be wavelength ranges corresponding to one of three primary colors of light (red, green, and blue) such as RGB. However, for convenience of explanation, the illustration of FIG. 4 is based on the first color filter layer 410 that transmits light of the first wavelength range.

When viewed in the direction perpendicular to the substrate 100, a side of the second color filter layer 420 may be disposed adjacent to a side of the first color filter layer 410. Likewise, when viewed in the direction perpendicular to the substrate 100, a side of the third color filter layer 430 may be disposed adjacent to another side of the first color filter layer 410.

In other words, when viewed in the direction perpendicular to the substrate 100, the second color filter layer 420 may be arranged adjacent to a side of the first color filter layer 410, and the third color filter layer 430 may be arranged adjacent to another side of the first color filter layer 410.

For example, the first color filter layer 410 may be arranged on the first pixel electrode 140 and may selectively transmit light of the first wavelength range. When viewed in the direction perpendicular to the substrate 100, a first length d between an edge of the 1-1$^{st}$ pixel opening OP1 and an edge of the 2-1$^{st}$ pixel opening OP2 may correspond to the first wavelength range. The first length d may be a length in a direction parallel with the substrate 100, when viewed in the direction perpendicular to the substrate 100, and the first length d may be proportionate to the first wavelength range. The first length d may be in a range of about 1.5 µm to about 2.5 µm. The first length d may be proportionate to the first wavelength range, in a range between about 1.5 µm and about 2.5 µm.

When viewed in the direction perpendicular to the substrate 100, the edge of the 1-1$^{st}$ pixel opening OP1 and the edge of the 2-1$^{st}$ pixel opening OP2 may be seen. The first length d between the edge of the 1-1$^{st}$ pixel opening OP1 and the edge of the 2-1$^{st}$ pixel opening OP2 may be proportionate to the first wavelength range.

For example, the wavelength range of red may be greater than the wavelength range of blue or green. Thus, the first length d between the edge of the 1-1$^{st}$ pixel opening OP1 and the edge of the 2-1$^{st}$ pixel opening OP2 may be greater in case that the color of light selectively transmitted by the first color filter layer 410 is red than in case that the color of light selectively transmitted by the first color filter layer 410 is blue or green. For example, the 2-1$^{st}$ pixel opening OP2 may be formed according to the first wavelength range.

The edge of the 1-1$^{st}$ pixel opening OP1 may define a line at which an upper surface of the first pixel electrode 140 and an end of the pixel-defining layer 105 meet each other, and the edge of the 2-1$^{st}$ pixel opening OP2 may define a line at which the inner surface of the 1-1$^{st}$ pixel opening OP1 and an end of the spacer layer 80 meet each other. The first length d between the edge of the 1-1$^{st}$ pixel opening OP1 and the edge of the 2-1$^{st}$ pixel opening OP2 may be in a range of about 1.5 µm to about 2.5 µm.

In case that the first length d between the edge of the 1-1$^{st}$ pixel opening OP1 and the edge of the 2-1$^{st}$ pixel opening OP2 is greater than about 2.5 µm, a step difference may be formed between the 1-1$^{st}$ pixel opening OP1 and the 2-1$^{st}$ pixel opening OP2, and thus, external light may be dispersed and reflected. In case that the first length d between the edge of the 1-1$^{st}$ pixel opening OP1 and the edge of the 2-1$^{st}$ pixel opening OP2 is less than about 1.5 µm, an error may occur in a process of forming the 2-1$^{st}$ pixel opening OP2, and a portion of the spacer layer 80 may cover a portion of the first pixel electrode 140, exposed by the 1-1$^{st}$ pixel opening OP1.

In an embodiment, in case that the first wavelength range is a red range, the first length d between the edge of the 1-1$^{st}$ pixel opening OP1 and the edge of the 2-1$^{st}$ pixel opening OP2 may be about 2.39 µm. In case that the first wavelength range is a green range, the first length d between the edge of the 1-1$^{st}$ pixel opening OP1 and the edge of the 2-1$^{st}$ pixel opening OP2 may be about 2.06 µm. In case that the first wavelength range is a blue range, the first length d between the edge of the 1-1$^{st}$ pixel opening OP1 and the edge of the 2-1$^{st}$ pixel opening OP2 may be about 1.74 µm.

A side surface of the spacer layer 80 defining the 2-1$^{st}$ pixel opening OP2 may have a 2-1$^{st}$ acute angle β with respect to an upper surface of the substrate 100. A side surface of the pixel-defining layer 105 defining the 1-1$^{st}$ pixel opening OP1 may have a 1-1$^{st}$ acute angle α with respect to the upper surface of the substrate 100.

The 1-1$^{st}$ acute angle α may be less than the 2-1$^{st}$ acute angle β. For example, the 2-1$^{st}$ acute angle β may be greater than the 1-1$^{st}$ acute angle α. In case that the spacer layer 80 having the 2-1$^{st}$ acute angle β covers at least a portion of the inner surface of the 1-1$^{st}$ pixel opening OP1, an incident angle of external light through the color filter layers 410, 420, and 430 may be increased. By increasing the incident angle, reflection of the incident external light toward the outside of the display apparatus may be reduced. In case that the reflection of external light to the outside of the display apparatus is reduced, the rainbow phenomenon may be minimized.

Thus, the 2-1$^{st}$ acute angle β may be inversely proportionate to the first wavelength range. For example, the 2-1$^{st}$ acute angle β may be inversely proportionate to the first length d between the edge of the 1-1$^{st}$ pixel opening OP1 and the edge of the 2-1$^{st}$ pixel opening OP2. For example, as the first length d between the edge of the 1-1$^{st}$ pixel opening OP1 and the edge of the 2-1$^{st}$ pixel opening OP2 decreases, an inclination of an inner surface of the 2-1$^{st}$ pixel opening OP2 may increase. In an embodiment, the 2-1$^{st}$ acute angle β may be in a range of about 30 degrees to about 45 degrees.

For example, in case that the first wavelength range is a red range (about 625 nm to about 750 nm), the 2-1$^{st}$ acute angle β may be about 32 degrees. In case that the first wavelength range is a green range (about 520 nm to about 570 nm), the 2-1$^{st}$ acute angle β may be about 36 degrees. In case that the first wavelength range is a blue range (about 450 nm to about 500 nm), the 2-1$^{st}$ acute angle β may be about 41 degrees.

In case that the 2-1$^{st}$ acute angle β is less than about 30 degrees or greater than about 45 degrees, an incident angle of the external light may be relatively decreased. Thus, the external light reflected by the inner surface of the 2-1$^{st}$ pixel opening OP2 may be reflected to the outside of the display apparatus.

The 2-1$^{st}$ acute angle β may be in a range of about 30 degrees to about 45 degrees, and thus, an appropriate taper angle may be formed to block the external light via a light-blocking layer BM to be described below, even in case that the external light is reflected by the inner surface of the 2-1$^{st}$ pixel opening OP2. This may be because the light-blocking layer BM may not only block the light incident from the outside of the display apparatus, but may also prevent the release of light from the display apparatus to the outside. By guiding the external light irradiated into the display apparatus and reflected to be oriented toward the light-blocking layer BM, a rainbow phenomenon, such as diffused reflection due to external light, etc., may be prevented or minimized.

When viewed in the direction perpendicular to the substrate 100, an edge of the first color filter layer 410 may overlap the light-blocking layer BM. Also, when viewed in the direction perpendicular to the substrate 100, an edge of the second color filter layer 420 and an edge of the third color filter layer 430 may also overlap the light-blocking layer BM.

The light-blocking layer BM may include a black matrix or may include various materials capable of absorbing at least a portion of light. For example, the light-blocking layer BM may include at least one of carbon black, graphite, chrome-based materials, dyes, a metallic reflection layer, and a light absorption layer. The light-blocking layer BM may not only block or prevent reflection of external light, but may also prevent internal reflection of light generated by the display device.

A thickness of the light-blocking layer BM may be less than or equal to few μm in the thickness direction of the substrate 100. In an embodiment, the thickness of the light-blocking layer BM may be in a range of about 1.4 μm to about 1.5 μm. In case that the thickness of the light-blocking layer BM is less than about 1.4 μm or greater than about 1.5 μm, a light-blocking rate may decrease.

The light-blocking layer BM may be arranged on the pixel-defining layer 105. For example, the light-blocking layer BM may not be arranged above the pixel opening exposing the first pixel electrode 140. The light-blocking layer BM may be arranged along the edges of the first to third color filter layers 410, 420, and 430. At least a portion of the light-blocking layer BM may be covered by the edges of the first to third color filter layers 410, 420, and 430. The light-blocking layer BM may be arranged on a thin-film encapsulation layer to be described below.

The light-blocking layer BM may be arranged on the spacer layer 80. In case that the light-blocking layer BM is arranged on the spacer layer 80, shocks or stress which may be applied to other components, in case that a mask is used in a process of forming elements on the light-blocking layer BM, such as the first to third color filter layers 410, 420, and 430, may be alleviated.

The light-blocking layer BM may include a 3-1$^{st}$ pixel opening OP3 arranged above the 2-1$^{st}$ pixel opening OP2 and exposing an upper surface of the thin-film encapsulation layer TFE to be described below. Here, an area of the 3-1$^{st}$ pixel opening OP3 may be greater than the area of the 1-1$^{st}$ pixel opening OP1 when viewed in the direction perpendicular to the substrate 100. This may be to prevent excessive blocking of light generated from an emission layer by the light-blocking layer BM.

Figure 5:
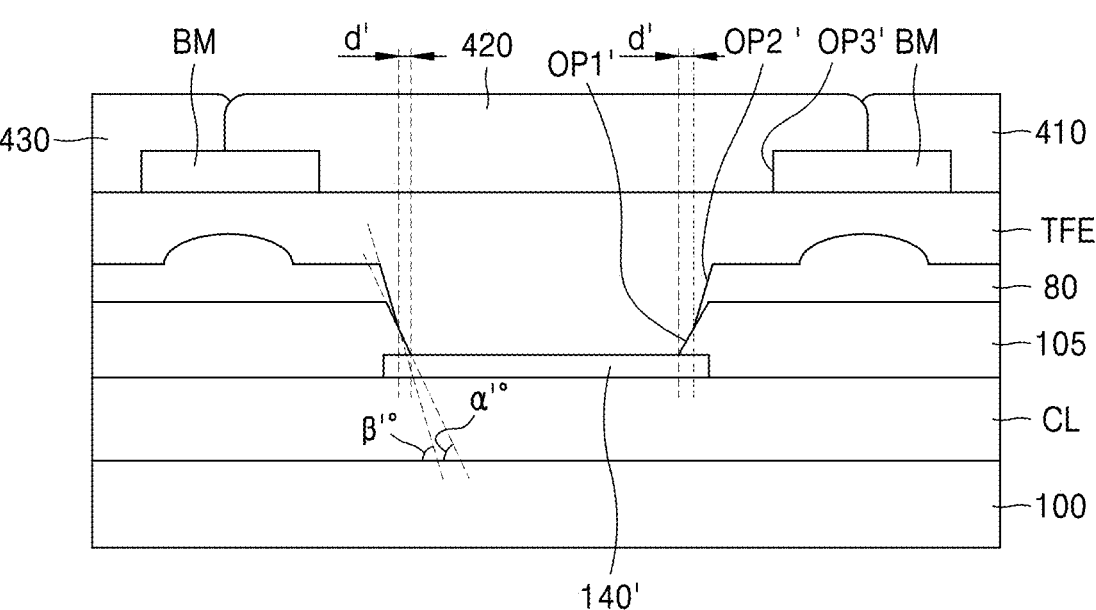
FIG. 5 is a schematic cross-sectional view of a region around a spacer layer of the display apparatus of FIG. 1.

FIG. 5 is a schematic cross-sectional view of a region around the spacer layer 80 of the display apparatus of FIG. 1. With respect to FIG. 5, aspects that are the same as the aspects described above or repeated aspects may not be described.

As illustrated in FIG. 5, the display apparatus according to an embodiment may further include a second pixel electrode 140'. The second pixel electrode 140' may be included in the pixel electrodes described above. The second pixel electrode 140' and the first pixel electrode 140 may be arranged on a same layer on the substrate 100.

For example, the second pixel electrode 140' and the first pixel electrode 140 may have same layer structure and include a same material. The second pixel electrode 140' may be arranged to be apart from the first pixel electrode 140. The second pixel electrode 140' may be another pixel electrode that is different from the first pixel electrode 140 from among the pixel electrodes.

The pixel-defining layer 105 may cover an edge of the second pixel electrode 140'. The pixel-defining layer 105 may further include a 1-2$^{nd}$ pixel opening OP1' exposing at least a portion of the second pixel electrode 140'. For example, the 1-2$^{nd}$ pixel opening OP1' may correspond to an exposed upper surface of the second pixel electrode 140'.

A third pixel electrode, a fourth pixel electrode, etc. may further be arranged, and features of the third pixel electrode, the fourth pixel electrode, etc. may be the same or substantially the same as the features of the first pixel electrode 140 and the second pixel electrode 140' described above.

The spacer layer 80 may include a 2-2$^{nd}$ pixel opening OP2' corresponding to the 1-2$^{nd}$ pixel opening OP1'. The 2-2$^{nd}$ pixel opening OP2' may expose a portion of the second pixel electrode 140'. The 2-2$^{nd}$ pixel opening OP2' may be arranged above the 1-2$^{nd}$ pixel opening OP1'. When viewed in a direction perpendicular to the substrate 100, an area of the 2-2$^{nd}$ pixel opening OP2' may be greater than or equal to an area of the 1-2$^{nd}$ pixel opening OP1'. In an embodiment, the area of the 2-2$^{nd}$ pixel opening OP2' may be greater than the area of the 1-2$^{nd}$ pixel opening OP1'.

The second color filter layer 420 may be arranged on the second pixel electrode 140' and may selectively transmit light of a second wavelength range. When viewed in the direction perpendicular to the substrate 100, a second length d' between an edge of the 1-2$^{nd}$ pixel opening OP1' and an edge of the 2-2$^{nd}$ pixel opening OP2' may correspond to the second wavelength range.

The second length d' may be a length in a direction parallel with the substrate 100, when viewed in the direction perpendicular to the substrate 100, and the second length d' may be proportionate to the second wavelength range. The second length d' may be in a range of about 1.5 μm to about 2.5 μm. For example, the second length d' may be proportionate to the second wavelength range, in the range between about 1.5 μm and about 2.5 μm. For example, in case that the first wavelength range is greater than the second wavelength range, the first length d described above may be greater than the second length d'. The first wavelength range and the second wavelength range may be compared based on median values of the first and second wavelength ranges or average values of minimum values and maximum values of the wavelength ranges.

Likewise, the light-blocking layer BM may further include a 3-$2^{nd}$ pixel opening OP3' arranged above the 2-$2^{nd}$ pixel opening OP2' and exposing the upper surface of the thin-film encapsulation layer TFE to be described below.

A 2-$2^{nd}$ acute angle β' may be formed by an inner surface of the 2-$2^{nd}$ pixel opening OP2' and an upper surface of the substrate 100. The 2-$2^{nd}$ acute angle β' may be proportionate to the second wavelength range.

For example, in case that the first wavelength range is greater than the second wavelength range, the 2-$2^{nd}$ acute angle β' may be greater than the 2-$1^{st}$ acute angle β. For example, in case that the first wavelength range is greater than the second wavelength range, the 2-$1^{st}$ acute angle β may be less than the 2-$2^{nd}$ acute angle β'.

Thus, the 2-$2^{nd}$ acute angle β' may be inversely proportionate to the second wavelength range. For example, the 2-$2^{nd}$ acute angle β' may be inversely proportionate to the second length d' between the edge of the 1-$2^{nd}$ pixel opening OP1' and the edge of the 2-$2^{nd}$ pixel opening OP2'. For example, as the second length d' between the edge of the 1-$2^{nd}$ pixel opening OP1' and the edge of the 2-$2^{nd}$ pixel opening OP2' decreases, an inclination of an inner surface of the 2-$2^{nd}$ pixel opening OP2' may increase. The 2-$2^{nd}$ acute angle β' may be in a range of about 30 degrees to about 45 degrees.

Figure 6:
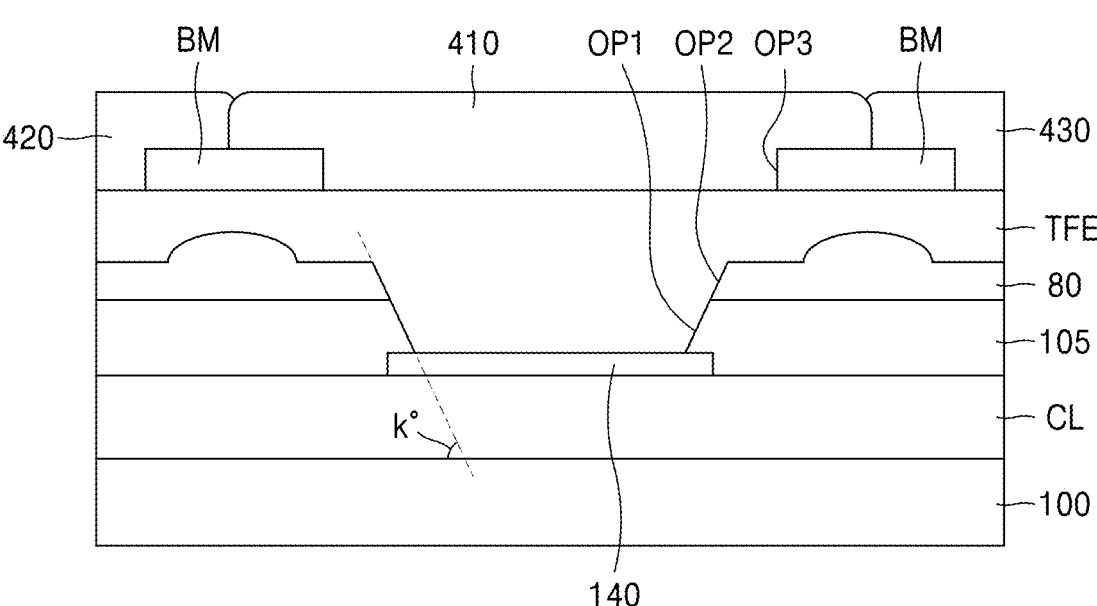
FIG. 6 is a schematic cross-sectional view of a region around a spacer layer of the display apparatus of FIG. 1.

FIG. 6 is a schematic cross-sectional view of a region around the spacer layer 80 of the display apparatus of FIG. 1. With respect to FIG. 6, aspects that are the same as the aspects described above or repeated aspects may not be described.

As illustrated in FIG. 6, an inner surface of the 2-$1^{st}$ pixel opening OP2 and an inner surface of the 1-$1^{st}$ pixel opening OP1 may form a continuous surface. For example, the inner surface of the 2-$1^{st}$ pixel opening OP2 may have an acute angle k with respect to an upper surface of the substrate 100, and the acute angle k and the 2-$1^{st}$ acute angle β of FIG. 4 described above may have same characteristics. Because the inner surface of the 2-$1^{st}$ pixel opening OP2 and the inner surface of the 1-$1^{st}$ pixel opening OP1 may form the continuous surface, the inner surface of the 1-$1^{st}$ pixel opening OP1 may also have the acute angle k with respect to the upper surface of the substrate 100.

Figure 7:
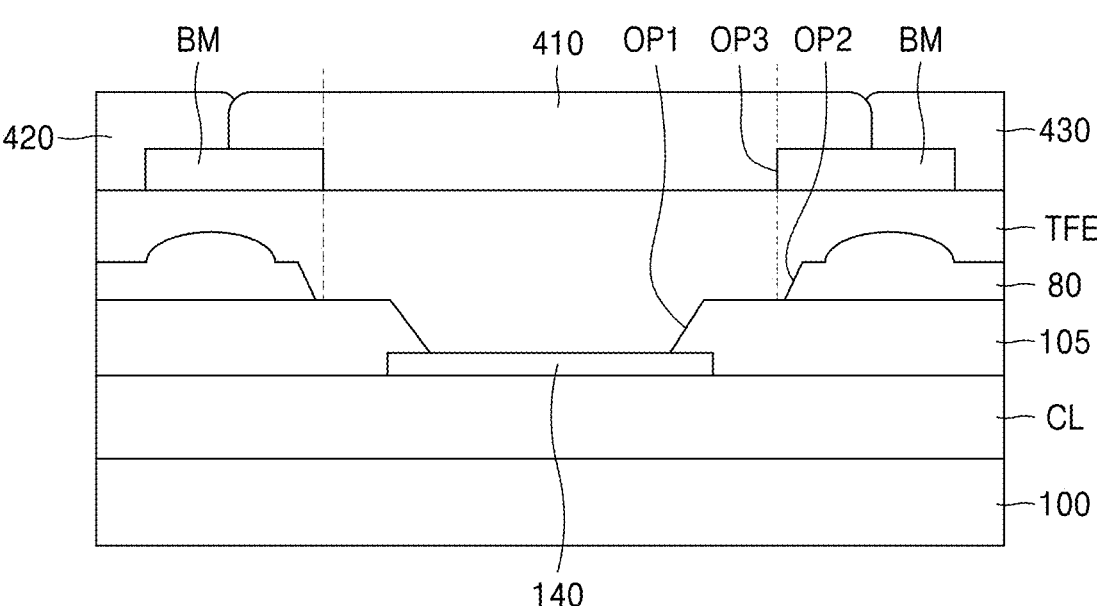
FIG. 7 is a schematic cross-sectional view of a region around a spacer layer of the display apparatus of FIG. 1.

FIG. 7 is a schematic cross-sectional view of a region around the spacer layer 80 of the display apparatus of FIG. 1. With respect to FIG. 7, aspects that are the same as the aspects described above or repeated aspects may not be described.

As illustrated in FIG. 7, an edge of the 2-$1^{st}$ pixel opening OP2 may overlap the light-blocking layer BM when viewed in a direction perpendicular to the substrate 100. For example, when viewed in the direction perpendicular to the substrate 100, the inner surface of the 2-$1^{st}$ pixel opening OP2 may be arranged to overlap the light-blocking layer BM. Thus, the inner surface of the 2-$1^{st}$ pixel opening OP2 may be hidden when viewed in the direction perpendicular to the substrate 100.

Based on this structure, even in case that a step difference occurs between the pixel-defining layer 105 and the spacer layer 80, external light may not reach the step difference. Even in case that the external light reaches the step difference, the reflected external light may be blocked by the light-blocking layer BM. As a result, the rainbow phenomenon due to diffuse reflectance may be reduced.

Figure 8:
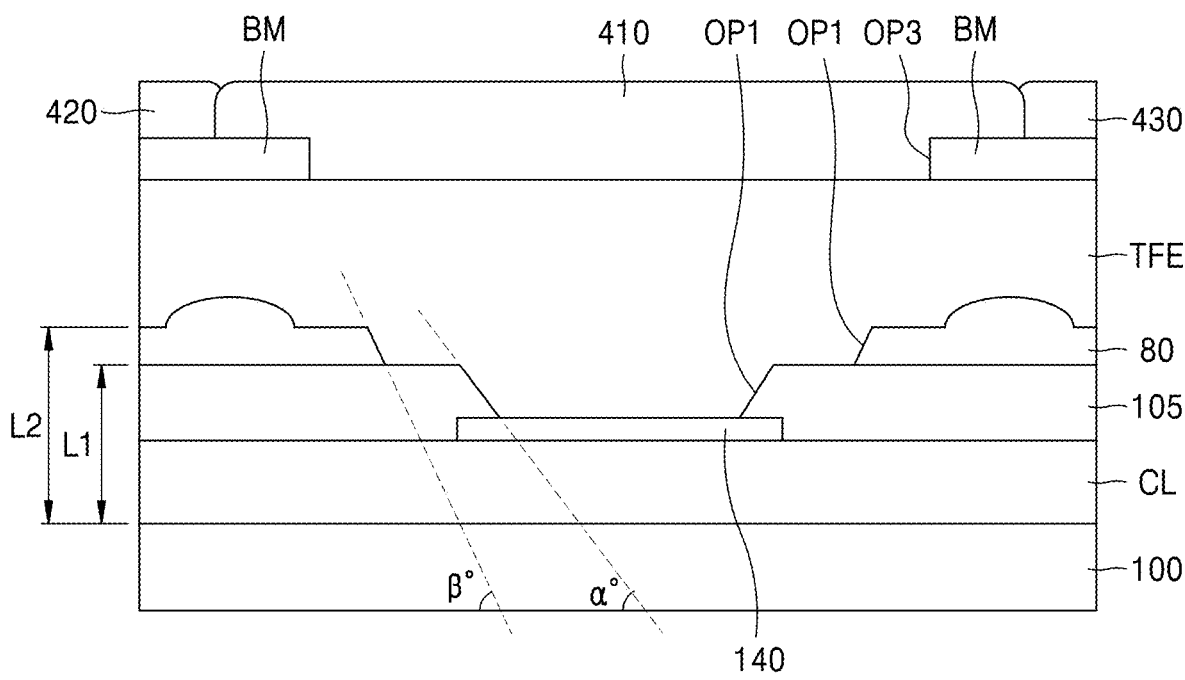
FIG. 8 is a schematic cross-sectional view of a region around a spacer layer of the display apparatus of FIG. 1.

FIG. 8 is a schematic cross-sectional view of a region around the spacer layer 80 of the display apparatus of FIG. 1. With respect to FIG. 8, aspects that are the same as the aspects described above or repeated aspects may not be described.

As illustrated in FIG. 8, in order to reduce rainbow effects, a length L2 from an upper surface of the spacer layer 80 to an upper surface of the substrate 100 or a length L1 from an upper surface of the pixel-defining layer 105 to the upper surface of the substrate 100 may be adjusted.

The length L2 from the upper surface of the spacer layer 80 to the upper surface of the substrate 100 may correspond to a thickness of the spacer layer 80. The length L2 from the upper surface of the spacer layer 80 to the upper surface of the substrate 100 or the thickness of the spacer layer 80 may be a length or thickness of the spacer layer 80 except for the protrusion portion of the spacer layer 80.

The thickness of the spacer layer 80 in the thickness direction of the substrate 100 may be less than or equal to about 0.4 μm. Thus, the length L2 from the upper surface of the spacer layer 80 to the upper surface of the substrate 100 may correspond to a value obtained by adding, to the thickness of the spacer layer 80, the length L1 from the upper surface of the pixel-defining layer 105 to the upper surface of the substrate 100.

In case that the thickness of the spacer layer 80 is less than or equal to about 0.4 μm, the 2-$1^{st}$ acute angle β may be reduced, and an area of the inner surface of the 2-$1^{st}$ pixel opening OP2 may be reduced. In other words, in case that the area of the inner surface of the 2-$1^{st}$ pixel opening OP2 is sufficiently reduced, the amount of external light dispersed by the inner surface of the 2-$1^{st}$ pixel opening OP2 may be reduced. In case that the thickness of the spacer layer 80 is greater than about 0.4 μm, significant reduction of the rainbow effects may not be identified even in case that the thickness of the spacer layer 80 is reduced.

The length L1 from the upper surface of the pixel-defining layer 105 to the upper surface of the substrate 100 may be less than or equal to about 1 μm. However, the length L1 from the upper surface of the pixel-defining layer 105 to the upper surface of the substrate 100 may be greater than a value obtained by summing a thickness of the first pixel electrode 140 and a thickness of the circuit layer CL.

In case that the length L1 from the upper surface of the pixel-defining layer 105 to the upper surface of the substrate 100 is less than or equal to about 1 μm, the 1-$1^{st}$ acute angle α may be reduced, and an area of the inner surface of the 1-$1^{st}$ pixel opening OP1 may be reduced. In other words, in case that the area of the inner surface of the 1-$1^{st}$ pixel opening OP1 is sufficiently reduced, the amount of external light dispersed by the inner surface of the 1-$1^{st}$ pixel opening OP1 may be reduced. In case that the length L1 from the upper surface of the pixel-defining layer 105 to the upper surface of the substrate 100 is greater than about 1 μm, significant reduction of the rainbow effects may not be identified even in case that the length L1 is reduced.

On the contrary, in order to reduce the rainbow effects, the 1-$1^{st}$ acute angle α and/or the 2-$1^{st}$ acute angle β may be increased. For example, in case that the 1-$1^{st}$ acute angle α and/or the 2-$1^{st}$ acute angle β are/is greater than or equal to about 70 degrees, the areas of the inner surfaces of the 1-$1^{st}$ pixel opening OP1 and the 2-$1^{st}$ pixel opening OP2 may be sufficiently reduced when viewed in the direction perpendicular to the substrate 100, even in case that external light is incident through an opening of the light-blocking layer BM. Thus, in case that the areas of the inner surfaces of the 1-$1^{st}$ pixel opening OP1 and the 2-$1^{st}$ pixel opening OP2 are sufficiently reduced when viewed in the direction perpendicular to the substrate 100, the amount of external light dispersed by the areas of the inner surfaces of the 1-1$^{st}$ pixel opening OP1 and the 2-1$^{st}$ pixel opening OP2 may be reduced.

Also, in case that the 1-1$^{st}$ acute angle α and/or the 2-1$^{st}$ acute angle β are/is greater than or equal to about 70 degrees, external light may not return to the outside of the display apparatus and may be reflected in the display apparatus, even in case that the external light is incident. Thus, by increasing the 1-1$^{st}$ acute angle α and/or the 2-1$^{st}$ acute angle β to be greater than or equal to about 70 degrees, the ratio of external light returning to the outside of the display apparatus and the external light incident to the display apparatus may be significantly reduced. In an embodiment, the 1-1$^{st}$ acute angle α and/or the 2-1$^{st}$ acute angle β may be in a range of about 70 degrees to about 80 degrees.

The spacer layer 80 may have a portion protruding in the direction perpendicular to the substrate 100, and the protruding portion may overlap the light-blocking layer BM when viewed in the direction perpendicular to the substrate 100. In case that the protruding portion is arranged below the light-blocking layer, light reflection may be reduced from the protruding portion.

Figure 9:
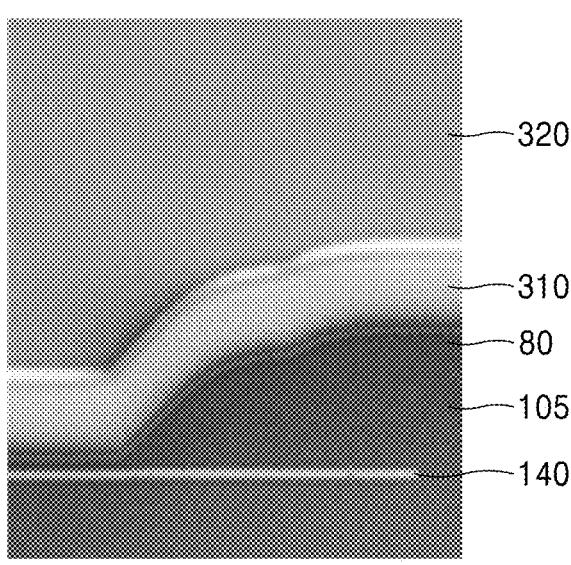
FIG. 9 is a picture obtained by enlarging a region around a spacer layer of a display apparatus according to a comparative embodiment.

FIG. 9 is a picture obtained by enlarging a region around a spacer layer of a display apparatus according to a comparative embodiment.

As illustrated in FIG. 9, the display apparatus may include the first pixel electrode 140, the pixel-defining layer 105, the spacer layer 80, the first inorganic encapsulation layer 310, and the organic encapsulation layer 320, and a step difference may be seen between the spacer layer 80 and the pixel-defining layer 105. Due to the step difference between the spacer layer 80 and the pixel-defining layer 105, the first inorganic encapsulation layer 310 may also have the step difference.

In case that external light is irradiated to the step difference, diffused reflection according to a shape of the step difference may occur, to cause the rainbow effects described above. Thus, image quality of the display apparatus may deteriorate.

Figure 10:
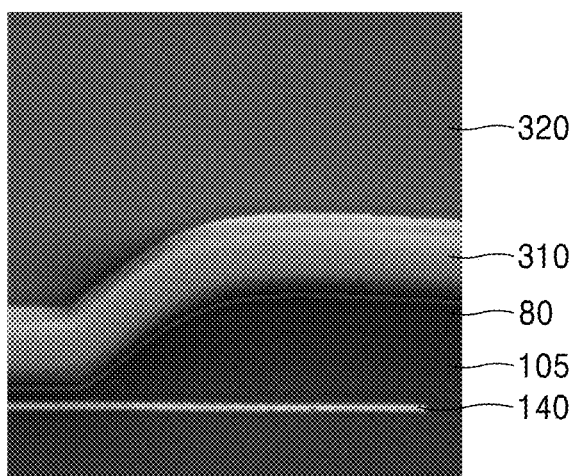
FIG. 10 is a picture obtained by enlarging a region around a spacer layer of the display apparatus of FIG. 1.

FIG. 10 is a picture obtained by enlarging a region around the spacer layer 80 of the display apparatus of FIG. 1.

As illustrated in FIG. 10, the display apparatus may include the first pixel electrode 140, the pixel-defining layer 105, the spacer layer 80, the first inorganic encapsulation layer 310, and the organic encapsulation layer 320. Unlike the display apparatus illustrated in FIG. 9, the display apparatus of FIG. 10 may not have a step difference between the spacer layer 80 and the pixel-defining layer 105. By removing the step difference which may cause rainbow effects due to dispersion of external light, the rainbow effects which may deteriorate image quality of the display apparatus may be prevented or minimized.

For example, the cross-sectional views of the display apparatus of FIGS. 4 to 6 illustrate embodiments in which a step difference which may cause the rainbow effects may be removed or minimized.

According to the embodiments described above, a display apparatus for minimizing deterioration of image quality which may be caused by external light may be provided. However, the scope of the disclosure is not limited to this effect as described above.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display apparatus comprising:
a first pixel electrode arranged on a substrate;
a pixel-defining layer arranged on the substrate, covering an edge of the first pixel electrode, and including a 1-1$^{st}$ pixel opening exposing a portion of the first pixel electrode;
a spacer layer arranged on the pixel-defining layer and including a 2-1$^{st}$ pixel opening corresponding to the 1-1$^{st}$ pixel opening and exposing the portion of the first pixel electrode; and
a first color filter layer arranged on the first pixel electrode and selectively transmitting light of a first wavelength range, wherein
in a plan view, a first length between an edge of the 1-1$^{st}$ pixel opening and an edge of the 2-1$^{st}$ pixel opening in a direction corresponds to the first wavelength range.

2. The display apparatus of claim 1, further comprising:
a second pixel electrode arranged on the substrate spaced apart from the first pixel electrode; and
a second color filter layer arranged on the second pixel electrode and selectively transmitting light of a second wavelength range that is different from the first wavelength range, wherein
the first pixel electrode and the second pixel electrode are arranged on a same layer,
the pixel-defining layer covers an edge of the second pixel electrode and further includes a 1-2$^{nd}$ pixel opening exposing a portion of the second pixel electrode,
the spacer layer further includes a 2-2$^{nd}$ pixel opening corresponding to the 1-2$^{nd}$ pixel opening and exposing the portion of the second pixel electrode, and
in a plan view, a second length between an edge of the 1-2$^{nd}$ pixel opening and an edge of the 2-2$^{nd}$ pixel opening in the direction corresponds to the second wavelength range.

3. The display apparatus of claim 2, wherein
the first wavelength range is greater than the second wavelength range, and
the first length is greater than the second length.

4. The display apparatus of claim 1, wherein the first length is in a range of about 1.5 μm to about 2.5 μm.

5. The display apparatus of claim 1, wherein an area of the 2-1$^{st}$ pixel opening is greater than an area of the 1-1$^{st}$ pixel opening, in a plan view.

6. The display apparatus of claim 2, wherein the spacer layer covers at least a portion of a side surface of the 1-1$^{st}$ pixel opening.

7. The display apparatus of claim 6, wherein the edge of the 2-1$^{st}$ pixel opening overlaps the side surface of the 1-1$^{st}$ pixel opening, in a plan view.

8. The display apparatus of claim 6, wherein an area of the 2-1$^{st}$ pixel opening is greater than or equal to an area of the 1-1$^{st}$ pixel opening, in a plan view.

9. The display apparatus of claim 6, wherein a 2-1$^{st}$ acute angle formed between a side surface of the 2-1$^{st}$ pixel opening and an upper surface of the substrate corresponds to the first wavelength range, and a 2-2$^{nd}$ acute angle formed between a side surface of the 2-2$^{nd}$ pixel opening and the upper surface of the substrate corresponds to the second wavelength range.

10. The display apparatus of claim 9, wherein the first wavelength range is greater than the second wavelength range, and the 2-1$^{st}$ acute angle is less than the 2-2$^{nd}$ acute angle.

11. The display apparatus of claim 9, wherein the 2-1$^{st}$ acute angle is in a range of about 30 degrees to about 45 degrees.

12. The display apparatus of claim 9, wherein a 1-1$^{st}$ acute angle formed between the side surface of the 1-1$^{st}$ pixel opening and the upper surface of the substrate is less than the 2-1$^{st}$ acute angle.

13. The display apparatus of claim 1, further comprising:

a thin-film encapsulation layer arranged on the first pixel electrode, the pixel-defining layer, and the spacer layer; and a light-blocking layer arranged on the thin-film encapsulation layer along an edge of the first color filter layer, having at least a portion covered by the edge of the first color filter layer, and including a 3-1$^{st}$ pixel opening arranged above the 2-1$^{st}$ pixel opening and exposing an upper surface of the thin-film encapsulation layer.

14. The display apparatus of claim 13, wherein an area of the 3-1$^{st}$ pixel opening is greater than an area of the 1-1$^{st}$ pixel opening, in a plan view.

15. The display apparatus of claim 13, wherein the edge of the 2-1$^{st}$ pixel opening overlaps the light-blocking layer, in a plan view.

16. The display apparatus of claim 13, wherein a side surface of the 2-1$^{st}$ pixel opening overlaps the light-blocking layer, in a plan view.

17. The display apparatus of claim 13, wherein a thickness of the spacer layer in a thickness direction of the substrate is less than or equal to about 0.4 μm.

18. The display apparatus of claim 1, wherein a length from an upper surface of the pixel-defining layer to an upper surface of the substrate is less than or equal to about 1 μm.

19. The display apparatus of claim 1, wherein a 1-1$^{st}$ acute angle formed between a side surface of the 1-1$^{st}$ pixel opening and an upper surface of the substrate is greater than or equal to about 70 degrees.

20. A display apparatus comprising:

a first pixel electrode arranged on a substrate;

a pixel-defining layer arranged on the substrate, covering an edge of the first pixel electrode, and including a 1-1$^{st}$ pixel opening exposing at least a portion of the first pixel electrode; and a spacer layer arranged on the pixel-defining layer, including a 2-1$^{st}$ pixel opening corresponding to the 1-1$^{st}$ pixel opening and exposing at least the portion of the first pixel electrode, and covering at least a portion of a side surface of the 1-1$^{st}$ pixel opening, wherein in a plan view, an area of the 2-1$^{st}$ pixel opening is greater than or equal to an area of the 1-1$^{st}$ pixel opening.

* * * * *